(12) United States Patent
Cole et al.

(10) Patent No.: US 8,071,260 B1
(45) Date of Patent: *Dec. 6, 2011

(54) THERMOPLASTIC HOLOGRAPHIC MEDIA

(75) Inventors: Michael C. Cole, Longmont, CO (US); Timothy J. Trentler, Longmont, CO (US)

(73) Assignee: InPhase Technologies, Inc., Longmont, CO (US)

( * ) Notice: Subject to any disclaimer, the term of this patent is extended or adjusted under 35 U.S.C. 154(b) by 990 days.

This patent is subject to a terminal disclaimer.

(21) Appl. No.: 10/866,823

(22) Filed: Jun. 15, 2004

(51) Int. Cl.
*G03H 1/02* (2006.01)

(52) U.S. Cl. .......... 430/1; 430/2; 430/280.1; 430/281.1; 359/3

(58) Field of Classification Search .................. None
See application file for complete search history.

(56) References Cited

U.S. PATENT DOCUMENTS

| | | | | |
|---|---|---|---|---|
| 3,765,898 A | * | 10/1973 | Bauer et al. | 430/281.1 |
| 3,809,732 A | * | 5/1974 | Chandross et al. | 430/321 |
| 4,394,435 A | * | 7/1983 | Farber et al. | 430/287.1 |
| 4,423,135 A | * | 12/1983 | Chen et al. | 430/271.1 |
| 4,842,968 A | * | 6/1989 | Kojima et al. | 430/1 |
| 4,842,987 A | * | 6/1989 | Elzer et al. | 430/281.1 |
| 4,942,102 A | * | 7/1990 | Keys et al. | 430/1 |
| 4,978,604 A | * | 12/1990 | Banks et al. | 430/327 |
| 4,996,120 A | * | 2/1991 | Smothers et al. | 430/2 |
| 5,058,124 A | | 10/1991 | Cameron et al. | |
| 5,219,710 A | | 6/1993 | Horn et al. | |
| 5,236,808 A | * | 8/1993 | Smothers | 430/281.1 |
| 5,292,620 A | | 3/1994 | Booth et al. | |
| 5,633,100 A | * | 5/1997 | Mickish et al. | 430/1 |
| 5,665,494 A | * | 9/1997 | Kawabata et al. | 430/2 |
| 5,719,691 A | | 2/1998 | Curtis et al. | |
| 5,874,187 A | | 2/1999 | Colvin et al. | |
| 5,932,045 A | | 8/1999 | Campbell et al. | |
| 6,047,008 A | | 4/2000 | Funakawa | |
| 6,103,454 A | | 8/2000 | Dhar et al. | |
| 6,124,076 A | | 9/2000 | Dhar et al. | |
| 6,414,763 B1 | | 7/2002 | Hesselink et al. | |
| 6,449,627 B1 | | 9/2002 | Baer et al. | |
| 6,482,551 B1 | | 11/2002 | Dhar et al. | |
| 6,551,759 B2 | * | 4/2003 | Daems et al. | 430/273.1 |

(Continued)

FOREIGN PATENT DOCUMENTS

JP 52-096102 * 8/1977

(Continued)

OTHER PUBLICATIONS

Gryte et al., "Hydrophillic interpolymer membranes from . . . " J. Appl. Poly. Sci. vol. 23, pp. 2611-2625 (1979).*

(Continued)

*Primary Examiner* — Martin Angebranndt (74) *Attorney, Agent, or Firm* — Vedder Price P.C.; Ajay A. Jagtiani (57) ABSTRACT

The present invention provides an article comprising: a binder component, a polymerizable component; and a photoinitiator component comprising at least one photoinitiator that causes the polymerizable component to form a polymer or co-polymer when a portion of the polymerizable component is exposed to a light source. The present invention also provides a method for making such an article, and a method and a system for holographically recording a spatial light distribution to such an article. The present invention also provides an article comprising: a binder component and a photoactive component, a method of making such an article, a method of recording to such an article and a system for recording to such an article.

65 Claims, 1 Drawing Sheet

U.S. PATENT DOCUMENTS

| | | | |
|---|---|---|---|
| 6,614,566 | B1 | 9/2003 | Curtis et al. |
| 6,858,253 | B2 * | 2/2005 | Williams et al. .............. 427/277 |
| 7,018,744 | B2 * | 3/2006 | Otaki et al. ....................... 430/1 |
| 7,092,133 | B2 | 8/2006 | Anderson et al. |
| 7,153,588 | B2 * | 12/2006 | McMan et al. ................ 428/483 |
| 2002/0172875 | A1 * | 11/2002 | Hu et al. ......................... 430/18 |
| 2003/0083395 | A1 * | 5/2003 | Trentler et al. ................. 522/38 |
| 2003/0138733 | A1 * | 7/2003 | Sachdev et al. .............. 430/311 |
| 2003/0157414 | A1 | 8/2003 | Dhal et al. |
| 2004/0027625 | A1 * | 2/2004 | Trentler et al. .................. 359/3 |
| 2008/0102378 | A1 * | 5/2008 | Cole et al. ........................ 430/2 |

FOREIGN PATENT DOCUMENTS

| | | | |
|---|---|---|---|
| WO | 01/96917 | * | 12/2001 |
| WO | 03/088234 | * | 10/2003 |

OTHER PUBLICATIONS

PCT/US2007/06094 International Search Report and the Written Opinion of the International Searching Authority, or the Declaration, mailed Aug. 22, 2008.

PCT/US2006/19906 International Search Report and the Written Opinion of the International Searching Authority, or the Declaration, mailed Sep. 16, 2008.

* cited by examiner

Figure

THERMOPLASTIC HOLOGRAPHIC MEDIA

BACKGROUND

1. Field of the Invention

The present invention relates to optical articles including holographic recording media, in particular media useful either with holographic storage systems or as components such as optical filters or beam steerers.

2. Related Art

Developers of information storage devices and methods continue to seek increased storage capacity. As part of this development, so-called page-wise memory systems, in particular holographic systems, have been suggested as alternatives to conventional memory devices. Page-wise systems involve the storage and readout of an entire two-dimensional representation, e.g., a page, of data. Typically, recording light passes through a two-dimensional array of dark and transparent areas representing data, and the holographic system stores, in three dimensions, holographic representations of the pages as patterns of varying refractive index imprinted into a storage medium. Holographic systems are discussed generally in D. Psaltis et al., "Holographic Memories," Scientific American, November 1995, the disclosure of which is hereby incorporated by reference. One method of holographic storage is phase correlation multiplex holography, which is described in U.S. Pat. No. 5,719,691, issued Feb. 17, 1998, the disclosure of which is hereby incorporated by reference. In one embodiment of phase correlation multiplex holography, a reference light beam is passed through a phase mask, and intersected in the recording medium with a signal beam that has passed through an array representing data, thereby forming a hologram in the medium. The spatial relation of the phase mask and the reference beam is adjusted for each successive page of data, thereby modulating the phase of the reference beam and allowing the data to be stored at overlapping areas in the medium. The data is later reconstructed by passing a reference beam through the original storage location with the same phase modulation used during data storage. It is also possible to use volume holograms as passive optical components to control or modify light directed at the medium, e.g., filters or beam steerers. Writing processes that provide refractive index changes are also capable of forming articles such as waveguides.

The capabilities of typical holographic storage systems are limited in part by the storage media. Iron-doped lithium niobate has been used as a storage medium for research purposes for many years. However, lithium niobate is expensive, exhibits poor sensitivity (1 J/cm$^2$), has low index contrast ($\Delta n$ of about $10^{-4}$), and exhibits destructive read-out (i.e., images are destroyed upon reading). Alternatives have therefore been sought, particularly in the area of photosensitive polymer films. See, e.g., W. K. Smothers et al., "Photopolymers for Holography," SPIE OE/Laser Conference, 1212-03, Los Angeles, Calif., 1990, the disclosure of which is hereby incorporated by reference. The material described in this article contains a photoimageable system containing a liquid monomer material (the photoactive monomer) and a photoinitiator (which promotes the polymerization of the monomer upon exposure to light), where the photoimageable system is in an organic polymer host matrix that is substantially inert to the exposure light. During writing of information into the material (by passing recording light through an array representing data), the monomer polymerizes in the exposed regions. Due to the lowering of the monomer concentration caused by the polymerization, monomer from the dark, unexposed regions of the material diffuses to the exposed regions. The polymerization and resulting concentration gradient create a refractive index change, forming the hologram representing the data. Unfortunately, deposition onto a substrate of the preformed matrix material containing the photoimageable system requires use of solvent and the necessity of using a solvent deposition process for forming the holographic storage medium. For example, it is difficult to use a solvent-based deposition method to form a data storage media having thicknesses greater than 150 µm, or to form a holographic recording medium that does not include a substrate onto which the holographic recording medium is deposited. Also, only a limited number of types of plastic may be used in an article formed using a solvent-based deposition method, and only a limited amount of post-processing may be performed on an article formed using a solvent-based deposition method.

SUMMARY

According to a first broad aspect of the present invention, there is provided an article comprising: a binder component comprising at least one thermoplastic; a polymerizable component comprising at least one photoactive monomer that is soluble in the binder component; and a photoinitiator component comprising at least one photoinitiator that causes the polymerizable component to form a polymer or co-polymer when a portion of the polymerizable component is exposed to a light source, wherein the article is capable of recording spatial light distribution via a spatial refractive index change.

According to a second broad aspect of the invention, there is provided a method for making a solid article comprising the following steps: (a) mixing together a binder component, a polymerizable component and a photoinitiator component to form a mixture; (b) heating the mixture to form a substantially homogeneous liquid; and (c) cooling the liquid to form the solid article, wherein the binder component comprises at least one thermoplastic, wherein the polymerizable component comprises at least one photoactive monomer that is soluble in the binder component, wherein the photoinitiator component comprises at least one photoinitiator that causes the polymerizable component to form a polymer or co-polymer when a portion of the polymerizable component is exposed to a light source, and wherein the article is capable of recording spatial light distribution via a spatial refractive index change.

According to a third broad aspect of the invention, there is provided a method for holographically recording a spatial light distribution via a spatial refractive index change to a holographic recording medium comprising: providing the holographic recording medium; and forming holographic gratings in the holographic recording medium by holographically recording the spatial light distribution via the spatial refractive index change to the holographic recording medium, wherein the holographic recording medium comprises: a binder component comprising at least one thermoplastic; a polymerizable component comprising at least one photoactive monomer that is soluble in the binder component; and a photoinitiator component comprising at least one photoinitiator that causes the polymerizable component to form a polymer or co-polymer when a portion of the polymerizable component is exposed to a light source.

According to a fourth broad aspect of the invention, there is provided a system for holographically recording a spatial light distribution via a spatial refractive index change to a holographic recording medium comprising: the holographic recording medium; and means for forming holographic gratings in the holographic recording medium by recording the spatial light distribution via the spatial refractive index change to the holographic recording medium, wherein the holographic recording medium comprises: a binder component comprising at least one thermoplastic; a polymerizable component comprising at least one photoactive monomer that is soluble in the binder component; and a photoinitiator component comprising at least one photoinitiator that causes the polymerizable component to form a polymer or co-polymer when a portion of the polymerizable component is exposed to a light source.

According to a fifth broad aspect of the invention, there is provided a solid article comprising: a binder component comprising at least one thermoplastic; and a photoactive component comprising at least one photoactive molecule, wherein the article is capable of recording spatial light distribution via a spatial refractive index.

According to a sixth broad aspect of the invention, there is provided a method for making a solid article comprising the following steps: (a) mixing a binder component with a photoactive component; (b) heating the mixture to form a substantially homogeneous liquid; and (c) cooling the liquid to form the solid article, wherein the binder component comprises at least one thermoplastic, wherein the photoactive component comprises at least one photoactive molecule, and wherein the solid article is capable of recording spatial light distribution via a spatial refractive index change.

According to a seventh broad aspect of the invention, there is provided a method for holographically recording a spatial light distribution via a spatial refractive index change to a holographic recording medium comprising the following steps: (a) providing the holographic recording medium; and (b) forming holographic gratings in the holographic recording medium by holographically recording the spatial light distribution via the spatial refractive index change to the holographic recording medium, wherein the holographic recording medium comprises: a binder component comprising at least one thermoplastic; and a photoactive component comprising at least one photoactive molecule.

According to an eighth broad aspect of the invention, there is provided a system for holographically recording a spatial light distribution via a spatial refractive index change to a holographic recording medium comprising: (a) the holographic recording medium; and (b) means for forming holographic gratings in the holographic recording medium by recording the spatial light distribution via the spatial refractive index change to the holographic recording medium, wherein the holographic recording medium comprises: a binder component comprising at least one thermoplastic; and a photoactive component comprising at least one photoactive molecule.

BRIEF DESCRIPTION OF THE DRAWING

The invention will be described in conjunction with the accompanying drawings, in which:

The sole drawing FIGURE shows a basic holographic storage system according to an embodiment of the present invention.

DETAILED DESCRIPTION

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, the term "light source" refers to any source of electromagnetic radiation of any wavelength. In one embodiment, the light source of the present invention is a laser of a particular wavelength.

For the purposes of the present invention, the term "capable of being used as a holographic storage medium" refers to an article that is capable of storing, in three dimensions, holographic representations of one or more pages as patterns of varying refractive index imprinted into an article of the present invention.

For the purposes of the present invention, the term "data page" or "page" refers to the conventional meaning of data page as used with respect to holography. For example, a data page may be a page of data, one or more pictures, etc. to be recorded to a holographic storage medium, such as an article of the present invention.

For the purposes of the present invention, the term "recording data" refers to storing holographic representations of one or more pages as patterns of varying refractive index in an article of the present invention.

For the purposes of the present invention, the term "reading data" refers to retrieving data stored as holographic representations from an article of the present invention.

For the purposes of the present invention, the term "binder component" refers to one or more thermoplastic materials of the present invention. Generally there is a sufficient amount of thermoplastic material in the binder component of an article of the present invention to allow an article of the present invention to be solid at room temperature and behave as a thermoplastic. Although the amount of thermoplastic material in an article of the present invention may vary, in one embodiment of the present invention, the amount of thermoplastic material may be as low as 5 wt % of an article of the present invention.

For the purposes of the present invention, the term "different form" refers to an article of the present invention being processed to form a product having a different form such as processing an article comprising a block of material, powder of material, chips of material, etc. into a molded product, a sheet, a free flexible film, a stiff card, a flexible card, an extruded product, a film deposited on a substrate, etc.

For the purposes of the present invention, the term "particle material" refers to a material that is made by grinding, shredding, fragmenting or otherwise subdividing an article into smaller components or to a material that is comprised of small components such as a powder.

For the purposes of the present invention, the term "free flexible film" refers to a thin sheet of flexible material that maintains its form without being supported on a substrate. Examples of free flexible films include the various types of plastic wraps used in food storage.

For the purposes of the present invention, the term "stiff article" refers to an article that may crack or crease when bent. An example of a stiff article is a plastic credit card, a DVD, a transparency, wrapping paper, a shipping box, etc.

For the purposes of the present invention, the term "volatile compound" refers to any chemical with a high vapor pressure and/or a boiling point below 150° C. Examples of volatile compounds include: acetone, methylene chloride, toluene, etc. An article, mixture or component is "volatile compound free" if the article, mixture or component does not include a volatile compound.

For the purposes of the present invention, the term "oligomer" refers to a polymer having approximately 30 repeat units or less or any large molecule able to diffuse at least 100 nm in approximately 2 minutes at room temperature when dissolved in the article of the present invention. Such oligomers may contain one or more polymerizable groups whereby the polymerizable groups may be the same or different from other possible monomers in the polymerizable component. Furthermore, when more than one polymerizable group is present on the oligomer, they may be the same or different. Additionally, oligomers may be dendritic.

For the purpose of the present invention, the term "photoinitiator" refers to the conventional meaning of the term photoinitiator and also refers to sensitizers and dyes. In general, a photoinitiator causes the curing of a material, such as a photoactive monomer, when the material containing the photoinitiator is exposed to light of a wavelength that activates the photoinitiator. The photoinitiator may refer to a combination of components, some of which individually are not light sensitive, yet in combination are capable of curing the photoactive monomer; examples are dye/amine, sensitizer/iodonium salt, dye/borate salt, etc.

For the purposes of the present invention, the term "photoinitiator component" refers to a single photoinitiator or a combination of two or more photoinitiators. For example, two or more photoinitiators may be used in the photoinitiator component of the present invention to allow recording at two or more different wavelengths of light.

For the purposes of the present invention the term "polymerizable component" refers to a mixture of one or more photoactive monomers, and possibly one or more additional monomers or oligomers that are capable of forming a polymer.

For the purposes of the present invention, the term "photobinding" refers to the forming of a covalent or noncovalent bond between an activated photoactive molecule and a photobinding receptor upon irradiation with an appropriate light source.

For the purposes of the present invention, the term "photoactive molecule" refers to any molecule that upon irradiation with an appropriate light source becomes active toward bonding with a photobinding receptor. A given photoactive molecule may be as large as an oligomer as defined previously; additionally, it may include more than one functional group, and each functional group may be the same or different. A given photoactive molecule may also contain photobinding receptors.

For the purposes of the present invention, the term "photobinding receptor" refers to a functional group that reacts with an activated photoactive molecule. The photobinding receptor may either be the same or different functionality from the photoactive molecule. In one embodiment of the present invention, the photobinding receptor is present on one or more binders and/or one or more oligomers of a composition used to make an article of the present invention.

For the purposes of the present invention, the term "photoactive component" refers to a single photoactive molecule or a mixture of photoactive molecules.

For the purposes of the present invention, the term "photoactive monomer" refers to the general meaning of the term "photoactive monomer," i.e., a monomer that polymerizes in the presence of a photoinitiator that has been activated by being exposed to a light source. In reference to the functional group that undergoes curing, the photoactive monomer comprises at least one such functional group. It is also understood that there exist photoactive monomers that are also photoinitiators, such as N-methylmaleimide, derivatized acetophenones, etc. In such a case, it is understood that the photoactive monomer of the present invention may also be a photoinitiator.

For purposes of the present invention, the term "photopolymer" refers to a polymer formed by one or more photoactive monomers, and possibly one or more additional monomers or oligomers.

For the purposes of the present invention, the term "plasticizer" refers to the conventional meaning of the term plasticizer. In general, a plasticizer is a compound added to a polymer both to facilitate processing and to increase the flexibility and/or toughness of a product by internal modification (solvation) of a polymer molecule.

For the purposes of the present invention, the term "thermoplastic" refers to the conventional meaning of thermoplastic, i.e., a compound substance that exhibits the property of a material, such as a high polymer, that softens when exposed to heat and generally returns to its original condition when cooled to room temperature. Examples of thermoplastics include, but are not limited to: poly(methyl vinyl ether-alt-maleic anhydride), poly(vinyl acetate), poly(styrene), poly(propylene), poly(ethylene oxide), linear nylons, linear polyesters, linear polycarbonates, linear polyurethanes, etc.

For the purposes of the present invention, the term "room temperature thermoplastic" refers to a thermoplastic that is solid at room temperature, i.e., will not cold flow at room temperature.

For the purposes of the present invention, the term "room temperature" refers to the commonly accepted meaning of room temperature.

For the purposes of the present invention, the term "slow thermosetting agent" refers to a compound added to an article of the present invention that will cause one or more thermoplastics in the binder component of the article to eventually thermoset, but which does not cause any of the thermoplastics in the binder component to become thermoset in fewer than 10 minutes when the article is cooled back to room temperature after the article has been heated to be in a flowable state.

For the purpose of this invention, the term "photoreversible" refers to materials such as photoactive molecules that are photoreversible, such as photochromics, photorefractives, and photodimerizations (2+2 or 4+4). However, in many embodiments of the present invention, mass diffusion may be the main cause of grating formation. For instance, when using an azo compound in a photoreversible isomerization, it is known that the two different possible isomers have different solubilities. Thus, in the mass diffusion scenario, light may be used to change the solubility of a freely diffusing component, thus creating regions where the solubility of the freely diffusing component is based on the spatial light distribution. Additionally, photodimerization can naturally incorporate mass diffusion, as one of the photoactive molecules in the photoactive component may be freely diffusing until it dimerizes with a photobinding receptor that is attached to the binder component.

DESCRIPTION

Previous holographic recording media have been a crosslinked matrix, a liquid, or solvent cast before recording of a hologram in the media. In contrast, the medium of the present invention is a meltable-solid article at room temperature. The medium of the present invention behaves as a thermoplastic material with a melting temperature above room temperature.

Figure 1:
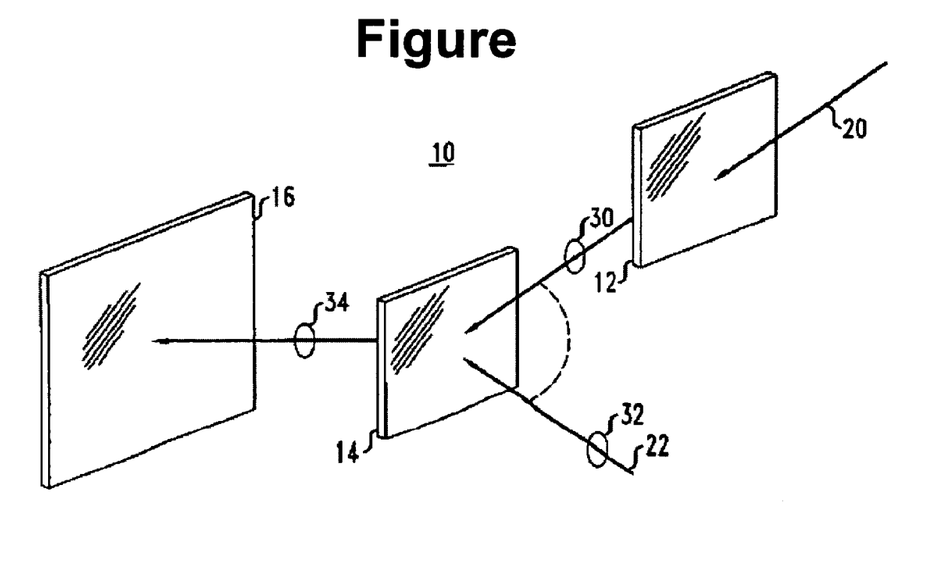

The drawing FIGURE illustrates the basic components of a holographic system 10. System 10 contains a modulating device 12, a photorecording medium 14, and a sensor 16. Modulating device 12 is any device capable of optically representing data in two-dimensions. Device 12 is typically a spatial light modulator that is attached to an encoding unit that encodes data onto the modulator. Based on the encoding, device 12 selectively passes or blocks portions of a signal beam 20 passing through device 12. In this manner, beam 20 is encoded with a data image. The image is stored by interfering the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location, or for holograms to be stored in overlapping positions, by, for example, varying the angle, the wavelength, or the phase of the reference beam 22, depending on the particular reference beam employed. Signal beam 20 typically passes through lens 30 before being intersected with reference beam 22 in medium 14. It is possible for reference beam 22 to pass through lens 32 before this intersection. Once data is stored in medium 14, it is possible to retrieve the data by intersecting reference beam 22 with medium 14 at the same location and at the same angle, wavelength, or phase at which reference beam 22 was directed during storage of the data. The reconstructed data passes through lens 34 and is detected by sensor 16. Sensor 16 is, for example, a charge coupled device or an active pixel sensor. Sensor 16 typically is attached to a unit that decodes the data.

In one embodiment of the present invention, the article of the present invention is formed by steps including: mixing a binder component, a polymerizable component, and photoinitiator component to form a mixture; heating the mixture to form a homogeneous liquid mixture; and cooling the liquid mixture in such a manner as to form an optically flat article. In one embodiment the difference in surface topography is no more than $\lambda/2$. The thermoplastics in the binder component and monomers and oligomers in the polymerizable component are selected such that (a) the process of heating the mixture of components to make the resulting article homogeneous does not trigger the reaction by which the photoactive monomer will be polymerized during writing of a pattern, e.g., data, and (b) the thermoplastics in the binder component and the photopolymer resulting from polymerization of the photoactive monomer, mixture of monomers, or the mixture of one or more monomers and one or more oligomers in the polymerizable component, are compatible with each other.

In one embodiment of the present invention, the article of the present invention exhibits an elastic modulus of at least about $10^5$ Pa, generally about $10^5$ Pa to about $10^9$ Pa, and advantageously about $10^6$ Pa to about $10^8$ Pa.

The compatibility of the binder component and the photopolymer of the present invention tend to prevent large-scale (preferably not >100 nm) phase separation of the binder component and the photopolymer, such large-scale phase separation typically leading to undesirable haziness or opacity. In one embodiment, the photoactive monomer and thermoplastics in the binder component are substantially free of cross-reaction during the process of article formation, and the photoactive monomer remains substantially inert. In addition, due to the photoactive monomer remaining inert during the process of making the article optically flat, there is no interference of the subsequent polymerization of the photoactive monomer.

In one embodiment of the present invention, at least one photoactive monomer in the polymerizable component contains one or more moieties, excluding the monomer functional groups, that are substantially absent from the binder component. Substantially absent means that less than 20 mole percent (based on the repeat unit of the thermoplastics in the binders) of the binder component would contain the particular moiety. The resulting optical article is capable of exhibiting desirable refractive index contrast due to the independence of the binder component from the photoactive monomer.

As discussed above, formation of a hologram, waveguide, or other optical article relies on a refractive index contrast ($\Delta n$) between exposed and unexposed regions of a medium, this contrast being at least partly due to monomer diffusion to exposed regions. High index contrast is generally desired because it provides improved signal strength when reading a hologram, and provides efficient confinement of an optical wave in a waveguide. One way to provide high index contrast in the invention is to use a photoactive monomer having moieties (referred to as index-contrasting moieties) that are substantially absent from the binder component, and that exhibit a refractive index substantially different from the index exhibited by the bulk of the binder component. For example, high contrast may be obtained by using a binder component that contains primarily aliphatic or saturated alicyclic moieties with a low concentration of heavy atoms and conjugated double bonds (providing low index) and a photoactive monomer made up primarily of aromatic or similar high-index moieties.

In applications of the present invention needing low scatter such as high density data storage, polymers are considered to be compatible if a blend of the polymers is characterized, in 90° light scattering, by a Rayleigh ratio (R90°) less than $7 \times 10^{-3}$ cm$^{-1}$. The Rayleigh ratio, $R\theta$, is a conventionally known property, and is defined as the energy scattered by a unit volume in the direction $\theta$, per steradian, when a medium is illuminated with a unit intensity of unpolarized light, as discussed in M. Kerker, The Scattering of Light and Other Electromagnetic Radiation, Academic Press, San Diego, 1969, the disclosure of which is hereby incorporated by reference. The light source used for the measurement is generally a laser having a wavelength in the visible part of the spectrum. Normally, the wavelength intended for use in writing holograms is used. The scattering measurements are made upon a photorecording material that has been flood exposed. The scattered light is collected at an angle of 90° from the incident light, typically by a photodetector. It is possible to place a narrowband filter, centered at the laser wavelength, in front of such a photodetector to block fluorescent light, although such a step is not required. The Rayleigh ratio is typically obtained by comparison to the energy scatter of a reference material having a known Rayleigh ratio.

Polymer blends which are considered to be miscible, e.g., according to conventional tests such as exhibition of a single glass transition temperature, will typically be compatible as well, i.e., miscibility is a subset of compatibility. Standard miscibility guidelines and tables are therefore useful in selecting a compatible blend. However, it is possible for polymer blends that are immiscible to be compatible according to the light scattering test above.

A polymer blend is generally considered to be miscible if the blend exhibits a single glass transition temperature, $T_g$, as measured by conventional methods. An immiscible blend will typically exhibit two glass transition temperatures corresponding to the $T_g$ values of the individual polymers. $T_g$ testing is most commonly performed by differential scanning calorimetry (DSC), which shows the $T_g$ as a step change in the heat flow (typically the ordinate). The reported $T_g$ is typically the temperature at which the ordinate reaches the mid-point between extrapolated baselines before and after the transition. It is also possible to use Dynamic Mechanical Analysis (DMA) to measure $T_g$. DMA measures the storage modulus of a material, which drops several orders of magnitude in the glass transition region. It is possible in certain cases for the polymers of a blend to have individual $T_g$ values that are close to each other. In such cases, conventional methods for resolving such overlapping $T_g$ should be used, such as discussed in Brinke et al., "The thermal characterization of multi-component systems by enthalpy relaxation," Thermochimica Acta., 238 (1994), at 75, the disclosure of which is hereby incorporated by reference.

Binder polymer and photopolymer that exhibit miscibility are capable of being selected in several ways. For example, several published compilations of miscible polymers are available, such as O. Olabisi et al., Polymer-Polymer Miscibility, Academic Press, New York, 1979; L. M. Robeson, MMI. Press Symp. Ser., 2, 177, 1982; L. A. Utracki, Polymer Alloys and Blends: Thermodynamics and Rheology, Hamer Publishers, Munich, 1989; and S. Krause in Polymer Handbook, J. Brandrup and E. H. Immergut, Eds.; 3rd Ed., Wiley Interscience, New York, 1989, pp. VI 347-370, the disclosures of which are hereby incorporated by reference. Even if a particular polymer of interest is not found in such references, the approach specified allows determination of a compatible photorecording material by employing a control sample.

Determination of miscible or compatible blends is further aided by intermolecular interaction considerations that typically drive miscibility. For example, it is well known that polystyrene and poly(methylvinylether) are miscible because of an attractive interaction between the methyl ether group and the phenyl ring. It is therefore possible to promote miscibility, or at least compatibility, of two polymers by using a methyl ether group in one polymer and a phenyl group in the other polymer. It has also been demonstrated that immiscible polymers are capable of being made miscible by the incorporation of appropriate functional groups that can provide ionic interactions. (See Z. L. Zhou and A. Eisenberg, J. Polym. Sci., Polym. Phys. Ed., 21 (4), 595, 1983; R. Murali and A. Eisenberg, J. Polym. Sci., Part B: Polym. Phys., 26 (7), 1385, 1988; and A. Natansohn et al., Makromol. Chem., Macromol. Symp., 16, 175, 1988, the disclosures of which are hereby incorporated by reference.) For example, polyisoprene and polystyrene are immiscible. However, when polyisoprene is partially sulfonated (5%), and 4-vinyl pyridine is copolymerized with the polystyrene, the blend of these two functionalized polymers is miscible. It is contemplated that the ionic interaction between the sulfonated groups and the pyridine group (proton transfer) is the driving force that makes this blend miscible. Similarly, polystyrene and poly(ethyl acrylate), which are normally immiscible, have been made miscible by lightly sulfonating the polystyrene. (See R. E. Taylor-Smith and R. A. Register, Macromolecules, 26, 2802, 1993, the disclosure of which is hereby incorporated by reference.) Charge-transfer has also been used to make miscible polymers that are otherwise immiscible. For example it has been demonstrated that, although poly(methyl acrylate) and poly (methyl methacrylate) are immiscible, blends in which the former is copolymerized with (N-ethylcarbazol-3-yl)methyl acrylate (electron donor) and the latter is copolymerized with 2-[(3,5-dinitrobenzoyl)oxy]ethyl methacrylate (electron acceptor) are miscible, provided the right amounts of donor and acceptor are used. (See M. C. Piton and A. Natansohn, Macromolecules, 28, 15, 1995, the disclosure of which is hereby incorporated by reference.) Poly(methyl methacrylate) and polystyrene are also capable of being made miscible using the corresponding donor-acceptor co-monomers (See M. C. Piton and A. Natansohn, Macromolecules, 28, 1605, 1995, the disclosure of which is hereby incorporated by reference).

A variety of test methods exist for evaluating the miscibility or compatibility of polymers, as reflected in the recent overview published in A. Hale and H. Bair, Ch. 4-"Polymer Blends and Block Copolymers," Thermal Characterization of Polymeric Materials, 2nd Ed., Academic Press, 1997, the disclosure of which is hereby incorporated by reference. For example, in the realm of optical methods, opacity typically indicates a two-phase material, whereas clarity generally indicates a compatible system. Other methods for evaluating miscibility include neutron scattering, infrared spectroscopy (IR), nuclear magnetic resonance (NMR), x-ray scattering and diffraction, fluorescence, Brillouin scattering, melt titration, calorimetry, and chemilluminescence. See, for example, L. Robeson, supra; S. Krause, Chemtracts-Macromol. Chem., 2, 367, 1991a; D. Vesely in Polymer Blends and Alloys, M. J. Folkes and P. S. Hope, Eds., Blackie Academic and Professional, Glasgow, pp. 103-125; M. M. Coleman et al., Specific Interactions and the Miscibility of Polymer Blends, Technomic Publishing, Lancaster, Pa., 1991; A. Garton, Infrared Spectroscopy of Polymer Blends Composites and Surfaces, Hanser, N.Y., 1992; L. W. Kelts et al., Macromolecules, 26, 2941, 1993; and J. L. White and P. A. Mirau, Macromolecules, 26, 3049, 1993; J. L. White and P. A. Mirau, Macromolecules, 27, 1648, 1994; and C. A. Cruz et al., Macromolecules, 12, 726, 1979; and C. J. Landry et al., Macromolecules, 26, 35, 1993, the disclosures of which are hereby incorporated by reference.

Compatibility has also been promoted in otherwise incompatible polymers by incorporating reactive groups into the polymer matrix, where such groups are capable of reacting with the photoactive monomer during the holographic recording step. Some of the photoactive monomer will thereby be grafted onto the matrix during recording. If there are enough of these grafts, it is possible to prevent or reduce phase separation during recording.

A holographic recording medium of the present invention is formed such that holographic writing and reading to the medium are possible. Typically, fabrication of the medium involves depositing binder component/polymerizable component/photoinitiator component mixture between two plates using, for example, a gasket to contain the mixture. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. In applications requiring optical flatness, the melted mixture may shrink during cooling and thus distort the optical flatness of the article. To reduce such effects, it is useful to place the article between plates in an apparatus containing mounts, e.g., vacuum chucks, capable of being adjusted in response to changes in parallelism and/or spacing. In such an apparatus, it is possible to monitor the parallelism in real-time by use of conventional interferometric methods, and to make any necessary adjustments to the heating/cooling process. Additionally, an article or substrate of the present invention may have an antireflective coating and/or be edge sealed to exclude water or oxygen. An antireflective coating may be deposited on an article or substrate by various processes such as chemical vapor deposition and an article or substrate may be edge sealed using known methods. The photorecording material of the present invention is also capable of being supported in other ways. More conventional polymer processing is also envisioned, e.g., closed mold formation or sheet extrusion. A stratified medium is also contemplated, i.e., a medium containing multiple substrates, e.g., glass, with layers of photorecording material disposed between the substrates.

Because the article of the present invention exhibits thermoplastic properties, an article of the present invention may also be heated above its melting temperature and processed in the ways described above for the binder component/polymerizable component/photoinitiator component mixture.

A holographic recording medium of the present invention is then capable of being used in a holographic system such as discussed previously. The amount of information capable of being stored in a holographic medium is proportional to the product of: the refractive index contrast, $\Delta n$, of the photorecording material, and the thickness, d, of the photorecording material. (The refractive index contrast, $\Delta n$, is conventionally known, and is defined as the amplitude of the sinusoidal variations in the refractive index of a material in which a plane-wave, volume hologram has been written. The refractive index varies as: $n(x)=n_0+\Delta n \cos(K_x)$, where $n(x)$ is the spatially varying refractive index, x is the position vector, K is the grating wave vector, and $n_0$ is the baseline refractive index of the medium. See, e.g., P. Hariharan, Optical Holography: Principles, Techniques and Applications, Cambridge University Press, Cambridge, 1991, at 44, the disclosure of which is hereby incorporated by reference.) The $\Delta n$ of a material is typically calculated from the diffraction efficiency or efficiencies of a single volume hologram or a multiplexed set of volume holograms recorded in a medium. The $\Delta n$ is associated with a medium before writing, but is observed by measurement performed after recording. Advantageously, the photorecording material of the invention exhibits a $\Delta n$ of $3\times10^{-3}$ or higher.

Examples of other optical articles include beam filters, beam steerers or deflectors, and optical couplers. (See, e.g., L. Solymar and D. Cooke, Volume Holography and Volume Gratings, Academic Press, 315-327 (1981), the disclosure of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angles travels undeflected through the hologram. (See, e.g., J. E. Ludman et al., "Very thick holographic nonspatial filtering of laser beams," Optical Engineering, Vol. 36, No. 6, 1700 (1997), the disclosure of which is hereby incorporated by reference.) A beam steerer is a hologram that deflects light incident at the Bragg angle. An optical coupler is typically a combination of beam deflectors that steer light from a source to a target. These articles, typically referred to as holographic optical elements, are fabricated by imaging a particular optical interference pattern within a recording medium, as discussed previously with respect to data storage. Media for these holographic optical elements are capable of being formed by the techniques discussed herein for recording media or waveguides.

As mentioned previously, the materials principles discussed herein are applicable not only to hologram formation, but also to formation of optical transmission devices such as waveguides. Polymeric optical waveguides are discussed for example in B. L. Booth, "Optical Interconnection Polymers," in Polymers for Lightwave and Integrated Optics, Technology and Applications, L. A. Hornak, ed., Marcel Dekker, Inc. (1992); U.S. Pat. No. 5,292,620; and U.S. Pat. No. 5,219,710, the disclosures of which are hereby incorporated by reference. Essentially, the recording material of the present invention is irradiated in a desired waveguide pattern to provide refractive index contrast between the waveguide pattern and the surrounding (cladding) material. It is possible for exposure to be performed, for example, by a focused laser light or by use of a mask with a non-focused light source. Generally, a single layer is exposed in this manner to provide the waveguide pattern, and additional layers are added to complete the cladding, thereby completing the waveguide. This process is discussed for example at pages 235-36 of Booth, supra, and Cols. 5 and 6 of U.S. Pat. No. 5,292,620, the disclosure of which is hereby incorporated by reference. A benefit of the present invention is that by using conventional molding techniques, it is possible to mold the binder mixture into a variety of shapes prior to formation of the article by cooling to room temperature. For example, the binder mixture can be molded into ridge waveguides, wherein refractive index patterns are then written into the molded structures. It is thereby possible to easily form structures such as Bragg gratings. This feature of the present invention increases the breadth of applications in which such polymeric waveguides would be useful. An article of the present invention may be used as a holographic recording medium that departs from prior data storage media by employing a binder made of one or more thermoplastic polymers in which the monomers and oligomers that form the grating are dissolved. The article of the present invention includes a binder component including one or more thermoplastics, a polymerizable component including one or more photoactive monomers and possibly one or more oligomers, and a photoinitiator component including one or more photoinitiators.

The binder component allows an article of the present invention to behave as if the entire article was a thermoplastic. That is, the binder component allows the article to be processed similar to the way that a thermoplastic is processed, i.e., molded into a shaped article, blown into a film, deposited in liquid form on a substrate, extruded, rolled, pressed, made into a sheet of material, etc. and then allowed to harden at room temperature to take on a stable shape or form. The binder component may comprise one or more thermoplastics. Suitable thermoplastics include poly(methyl vinyl ether-alt-maleic anhydride), poly(vinyl acetate), poly(styrene), poly(propylene), poly(ethylene oxide), linear nylons, linear polyesters, linear polycarbonates, linear polyurethanes, poly(vinyl chloride), poly(vinyl alcohol-co-vinyl acetate). The amount of thermoplastic used in the holographic recording medium of the present invention is preferably enough that the entire holographic recording medium effectively acts as a thermoplastic for most processing purposes. The binder component of the holographic recording medium may make up as much as 5%, preferably as much as 50%, and more preferably as much as 90% of the holographic recording medium by weight. The amount of any given binder in the holographic recording medium may vary based on clarity, refractive index, melting temperature, $T_g$, color, birefringence, solubility, etc. of the thermoplastic or thermoplastics that make up the binder component. Additionally, the amount of binder component in the holographic recording medium may vary based on the article's final form, whether it is a solid, a flexible film, or an adhesive.

In one embodiment, the binder may include a telechelic thermoplastic resin—meaning that the thermoplastic polymer may be functionalized with reactive groups that covalently crosslink the thermoplastic in the binder with the polymer formed from the polymerizable component during grating formation. Such crosslinking makes the gratings stored in the holographic recording medium very stable, even to elevated temperatures for extended periods of time.

In another embodiment of the present invention, the thermoplastic or thermoplastics in the binder become crosslinked noncovalently with the polymer formed upon grating formation by using a functionalized thermoplastic polymer in the binder component. Examples of such non-covalent bonding include ionic bonding, hydrogen bonding, dipole-dipole bonding, aromatic pi stacking, etc.

According to an embodiment of the present invention, the polymerizable component of an article of the present invention includes one or more monomers, at least one of which is a photoactive monomer, that form gratings made of a polymer or co-polymer when exposed to a light source, such as a laser beam that is recording data pages to the holographic recording medium. The photoactive monomer may be any monomer or monomers capable of undergoing photoinitiated polymerization, and which, in combination with a binder component, meets the compatibility requirements of the present invention. Suitable photoactive monomers include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. Free-radical copolymerizable pair systems such as vinyl ether mixed with maleate and thiol, vinyl ether functionalities, mixed with olefin are also suitable. It is also possible to use cationically polymerizable systems; a few examples are vinyl ethers, alkenyl ethers, allene ethers, ketene acetals, epoxides, etc. Furthermore, anionic polymerizable systems are suitable. It is also possible for a single photoactive monomer molecule to contain more than one polymerizable functional group. Other suitable photoactive monomers include cyclic disulfides and cyclic esters. Oligomers that may be included in the polymerizable component to form a grating upon exposure to a light source include oligomers such as oligomeric (ethylene sulfide) dithiol, oligomeric (phenylene sulfide) dithiol, oligomeric (bisphenol A), oligomeric (bisphenol A) diacrylate, oligomeric polyethylene with pendent vinyl ether groups, etc.

In addition to the photoactive monomer, an article of the present invention may contain a photoinitiator. The photoinitiator, upon exposure to relatively low levels of the recording light, chemically initiates the polymerization of the monomer, avoiding the need for direct light-induced polymerization of the monomer. The photoinitiator generally should offer a source of species that initiate polymerization of the particular photoactive monomer. Typically, 0.1 to 20 vol % photoinitiator provides desirable results.

The monomers and/or oligomers of the polymerizable component of an article of the present invention may be monofunctional, difunctional, and/or multifunctional.

A variety of photoinitiators known to those skilled in the art and available commercially are suitable for use in the invention. It is advantageous to use a photoinitiator that is sensitive to light at wavelengths available from conventional laser sources, e.g., the blue and green lines of $Ar^+$ (458, 488, 514 nm) and He—Cd lasers (442 nm), the green line of frequency doubled YAG lasers (532 nm), and the red lines of He—Ne (633 nm), $Kr^+$ lasers (647 and 676 nm), and various diode lasers (290 nm to 900 nm). One advantageous free radical photo initiator is bis($\eta$-5-2,4-cyclopentadien-1-yl)bis[2,6-difluoro-3-(1H-pyrrol-1-yl)phenyl]titanium, available commercially from Ciba as Irgacure 784™. Another visible free-radical photoinitiator (which requires a co-initiator) is 5,7, diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. In the case of cationically polymerizable monomers, a cationic photoinitiator is used, such as a sulfonium salt or an iodonium salt. These cationic photoinitiator salts absorb predominantly in the UV portion of the spectrum, and are therefore typically sensitized with a sensitizer or dye to allow use of the visible portion of the spectrum. An example of an alternative visible cationic photoinitiator is ($\eta_5$-2,4-cyclopentadien-1-yl) ($\eta_6$-isopropylbenzene)-iron(II) hexafluorophosphate, available commercially from Ciba as Irgacure 261.

In most embodiments, photoinitiators of the present invention are sensitive to ultraviolet and visible radiation from 200 nm to 800 nm.

An article of the present invention may also include additives such as plasticizers for altering the properties of the article of the present invention including the melting point, flexibility, toughness, diffusibility of the monomers, and ease of processibililty. Examples of suitable plasticizers include dibutyl phthalate, dichlorohexane, N,N-dimethylformamide, etc. Plasticizers differ from solvents in that solvents are typically evaporated whereas plasticizers are meant to remain in the article.

Some articles of the present invention may include plasticizers that act as slow thermosetting agents that thermoset a thermoplastic in the holographic recording medium by becoming crosslinked with the thermoplastic over a period of time once the holographic recording medium has been processed in a liquid state and allowed to cool. For example, when poly(methyl vinyl ether-alt-anhydride) is used as a thermoplastic in the binder component, glycerol ethoxylate may be used as a slow thermosetting agent, because the anhydride units in the thermoplastic may eventually react with the hydroxyl moieties in the slow thermosetting agent, but this reaction may not be significant during the process of forming the article, allowing the article to behave primarily as a thermoplastic with respect to melting, flowing and then solidifying over a short time scale. Any pair of functionalities that are slow to thermally react may be used to devise a suitable slow thermosetting system. For example, alcohols and epoxides are typically very slow to react (without a catalyst or with a poor catalyst) and thus, one may use a polyol binder with a multifunctional epoxide as the slow thermosetting agent. Other such pairings include, slow Diels-Alder reactions, hindered alcohols with hindered isocyanates, epoxides with cyclic anhydrides, etc.

Other types of additives that may be used in the liquid mixture and article of the present invention are inert diffusing agents having relatively high or low refractive indices. Other additives that may be used in the liquid mixture and article of the present invention include: pigments, fillers, nonphotoinitiating dyes, antioxidants, inhibitors, bleaching agents, mold releasing agents, antifoaming agents, infrared/microwave absorbers, surfactants, etc.

It has been determined that use of a thermoplastic binder and less than 20 volume % photoactive monomer/oligomer gives a medium capable of holographic recording; however, other formulations of thermoplastic binders and photoactive monomers/oligomers' may also be used in the present invention. Such a medium has a melting temperature above room temperature (preferably at least 10° C. above room temperature), and thus is a solid at room temperature. Fabrication of optically flat articles typically requires heating of the mixture used to make an optically flat medium above the softening or melting temperature of the medium. Once flatness is obtained, the medium is allowed to cool and thus return to solid thereby keeping the flatness of the medium. Upon exposure to light of appropriate wavelength for the photoactive monomer/oligomers (which includes multiple types of monomers as well as possibly mono, di, and multifunctional monomers/oligomers), the article may record the spatial light pattern, thus forming a hologram.

Although in one embodiment, the polymerizable component, consisting of one or more photoactive monomers and possibly one or more oligomers, of an article of the present invention is less than 20 volume %, in other embodiments, the polymerizable component of an article of the present invention may be less than 10 volume %, or even less than 5 volume %.

An article of the present invention may be any thickness needed. For example the article may be thin for display holography or thick for data storage. The article may be a film deposited on a substrate, a free flexible film (similar to food wraps) or a hard article requiring no substrate (similar to a credit card).

An article of the present invention may be heated to form a liquid mixture that is infused into a porous substrate such as glass (Vycor™), cloth and paper, wood or plastic; then allowed to cool. Such articles would be able to record holograms of a display and/or data nature.

An article of the present invention may be made optically flat via the appropriate processes, such as the process described in U.S. Pat. No. 5,932,045, the entire contents and disclosure of which is hereby incorporated by reference.

Also, the ability to use a wider variety of thermoplastics in an article of the present invention allows for the possible reduction or elimination of problems such as water or humidity that affect current holographic storage media. In one embodiment, the article of the present invention may be used to store volatile holograms. Due to the thermoplastic nature of the present invention, a particular mixture may be tuned to have a very general lifetime for the recorded holograms. Thus, after hologram recording, the holograms may be readable for a defined time period such as a week, a few months, or years. Over time, the article may be allowed to slowly creep, and thus destroy the readability of the holograms. Heating the article may also increase such a process of hologram destruction. Examples of applications for using volatile holograms include: rental movies, security information, tickets (or season passes), thermal history detector, time stamp, and/or temporary personal records, etc.

In one embodiment, an article of the present invention may be used to record permanent holograms. In such an embodiment, the $T_g$ of the article either increases or the mixture crosslinks during hologram formation. In the former case, the dissolved polymerizable component (behaving as a plasticizer) substantially lowers the melting temperature of the binder component, yet when a hologram is written, the monomer is essentially depleted and thus the plasticization effect is eliminated, thereby increasing the melting temperature of the post-recorded material. In the latter case, the binder may be telechelic or multifunctional with a polymerizable functionality capable of reacting with the monomer that allows for crosslinking during hologram formation. Alternatively, the binder component may have a slow thermosetting agent as described previously.

In one embodiment of the present invention, photobinding of photoactive molecules to the binder occurs. Suitable photoactive molecules for this application include: thiols, selenols, tellenols, disulfides, diselenides, ditellurides, and various photoiniferters. Additionally, molecules that are known to be both monomers and photoinitiators such as maleimides and maleic anhydrides are suitable photoactive molecules. Also suitable as photoactive molecules for photobinding are free radical photoinitiators (whether they be cleavage, hydrogen abstraction, electron transfer-proton transfer, or a combination of the three). These photobinding reactions typically would use a binder with unsaturated double bonds as the photobinding receptor. However, if a photobase or a photoacid generator were the photoactive molecule, then a binder with acid functionality or base functionality as photobinding receptors, respectively, may be used. In such an embodiment, it is understood that one could have an oligomer with photobinding receptors as well as functionality that allows for either covalent or noncovalent bonding to the binder or several other very similarly related configurations.

In one embodiment of the present invention, an article of the present invention may be used to store reversible holograms. Suitable photoactive molecules of the photoactive component include molecules containing C—C double bonds that undergo any of the various types of reversible photocycloaddition reactions. These may include anthracenes, acenaphthylenes, phenanthrenes, and related polyaromatic hydrocarbons, photodiene formation/Diels Alder reactions, and concerted and nonconcerted ene-ene reactions (2+2, 4+4, 4+2, 3+2, etc.). Also, metal and organic salts may be attached to photochelating groups, such as spiro compounds, chromenes, and the like. Nucleotides, such as DNA and RNA, may also be attached to such compounds via strong hydrogen bonding interactions. Polymer-bound metal complexes may be used as attachment sites for photoinsertion of various ligands. This list is exemplary and modifications or additions to the list may be determined by one of ordinary skill in the art in light of the teachings of the present invention.

Preferably, the photoactive molecules of the photoactive component react during hologram formation by a cycloaddition reaction. There are a variety of cycloaddition reactions that yield rings of different sizes, and that may be reversed using light of shorter wavelength than the wavelength first used to react the components, or using heat. Four-member rings (cyclobutanes) may be formed by (2+2) cycloadditions, and 8-membered rings may be formed by (4+4) cycloadditions. Acenaphthylenes, which are an example of species that undergo (2+2) cycloaddition reactions, are a more preferred type of write component. Acenaphthylenes typically posses a high refractive index and undergo forward and reverse reactions with a high quantum efficiency and minimal side reactions. Further, the forward and reverse photoreactions are at wavelengths that are easily accessible with current laser and light sources. Preferably, the binding of the photoactive molecules of the photoactive component to the binder may be reversed by exposing the optical article to light of a different wavelength than was used to bind the photoactive molecules of the photoactive component to the binder. Preferable binders for use with acenaphtylene-derived photoactive molecules are thermoplastic resins with pendent photobinding receptors of vinyl ether functionality. Suitable materials, including photoreversible photoactive molecules, for use in such articles are described in U.S. patent application Ser. No. 10/411,380, filed Apr. 11, 2003, the entire contents and disclosure of which is hereby incorporated by reference.

An article of the present invention may be ground, shredded, fragmented, etc. to form a particle material of powder, chips, etc. The particle material may be heated at a later time to form a flowable liquid used to make a molded product, a coating to apply to a substrate, etc.

When the particle material is a powder, the powder may be electrostatically applied to a substrate such as metal and other conductive materials (typical powder coating), which would then be heated to form a coating. The powder may also be infused into fibrous materials to form holographic paper, cardboard, ribbons, etc. for decorative applications. Additionally, the powder may be melt extruded into a fiber for thread, yarn, and fabric applications.

An article of the present invention may be used in a variety of products to provide tracking information. For example, the article may be part of a cardboard shipping box, a sheet of material from which the shipping box is made, or the paper in which a box is wrapped for shipping, package labeling, etc. The article may also be used for security purposes such as: a security label, part of a security label, a security tag, a piece of clothing, etc. The article may be used in indoor or outdoor advertising. For example, the article may be used in making billboards, park benches, as an advertising wrap for a vehicle, as a sign for mounting in or on a bus or subway, as a sign in a subway station, etc.

An article of the present invention may also be used for decorative purposes. For example, the article may be used in gift wrap or in window treatments to provide special artistic tinting or 3D designs. The article may be ground-up and used in coatings such as paint for houses, automobiles, furniture, etc. The article may be used in molded parts of automobiles, toys, furniture, appliances, etc. to provide decorative effects.

An article of the present invention may also be used to make data storage devices of various sizes and shapes, as a block of material or as part of a coating that is coated on a substrate.

EXAMPLES

Example 1

A mixture was formed having the following composition:
3.0 g—Poly(methyl vinyl ether-alt-maleic anhydride)—Mn aprox 80,000
  0.0103 g—Thionin Perchlorate
  0.077 g—Tetraphenyl Borate salt (tetrabutyl amine cation)
  0.1123 g—Tribromophenyl Acrylate
  0.587 g γGlycerol Ethoxylate-Mn 1000
  10 ml acetone The mixture was mixed until homogenous and then acetone was evaporated off under reduced pressure and then heated to 60° C. for 5 minutes to let bubbles escape. The remaining liquid mixture was then placed between heated glass substrates (glass temp was 80° C.) containing a Teflon™ spacer of 250 microns. The mixture was then allowed to cool to form an article of the present invention.

Using a 635 nm diode laser to record data pages to this article, this article produced a 4% diffraction grating. The grating was destroyed by heating to 60° C. for 20 minutes and upon heating to 100° C., the medium was able to flow, demonstrating that the medium was still a thermoplastic.

Example 2

A mixture was formed having the following composition:
  2.086 g—Poly(Vinyl Acetate)—Mw 83,000
  0.189 g—Bisphenol A Glycerolate (1 glycerol/phenol) diacrylate
  0.127 g—Hydroxypropyl Acrylate
  0.101 g—Glycerol Propoxylate—Mn 1500
  0.01 g—Darocure™ TPO (obtained from Ciba-Geigy)

The mixture was heated to 60° C. for 8 hours, then, while still hot, placed between 2 heated glass substrates. A thickness of 200 microns was obtained and the mixture was allowed to cool to room temperature, whereupon a homogenous, clear, bubble free article of the present invention was produced. Using a 407 nm diode laser to holographically record pages of data to this article, this article gave a shrinkage under 0.5% and a M/# for a 200 micron thick material of 2.75.

Example 3

An article using a telechelic binder is formed having the following composition:
  90 wt % Poly(vinyl acetate-co-alcohol) with pendant vinyl ether
  5 wt % Writing monomer such as a difunctional acrylate of Bisphenol A
  0.2 wt % Darocure™ TPO (blue light sensitive initiator)
  0.1 wt % Irganox™ Brand Antioxidant
  4.7 wt % Inert plasticizer such as poly(ethylene oxide) Mn=2000

This article may be formed using a process similar to that described above in Example 1 or 2. Alternatively, the composition may be processed in a standard thermoplastic manner such as placing all components into a hopper for grinding and mixing, and then extruding the resultant thermoplastic into a desired shape. This formulation is a thermoplastic until recording of the hologram, then the acrylate copolymerizes with the binder (via the vinyl ether linkages) to ultimately thermoset the mixture.

Example 4

An article providing an elevated $T_g$ and melting temperature is formed having the following composition:
  95 wt % Poly(vinyl acetate-co-alcohol) with pendant vinyl ether (attached by reaction to the alcohol)
  4.6 wt % Writing monomer such as a difunctional acrylate of Bisphenol A ethoxylate
  0.2 wt % Darocure™ TPO (blue light sensitive initiator)
  0.1 wt % Irganox™ Brand Antioxidant This article may be formed using a process similar to that described above in Example 1 or 2. Alternatively, the composition may be processed in a standard thermoplastic manner such as placing all components into a hopper for grinding and mixing, and then extruding the resultant thermoplastic into a desired shape. During recording, this article increases in both $T_g$ and melting temperature since the presence of the writing component effectively behaves as a plasticizer until it is polymerized during the recording of a hologram.

Example 5

An article employing non-covalent crosslinking is formed having the following composition:
  95 wt % Poly(maleic anhydride-co-butyl vinyl ether) with some of the anhydride groups' ring opened to form an alkyl ester and a carboxylic acid
  0.1 wt % Tertiary Amine Acrylate (such as 2-(diethylamino) ethyl acrylate)
  4.1 wt % A polymerizable component such as a monofunctional acrylate (tribromophenyl acrylate)
  0.1 wt % A surfactant additive (the surfactant will ensure that the ionic centers do not phase separate into domains large enough to scatter light).
  0.2 wt % A photoinitiator component This article may be formed using a process similar to that described above in Example 1 or 2. Alternatively, the composition may be processed in a standard thermoplastic manner such as placing all components into a hopper for grinding and mixing, and then extruding the resultant thermoplastic into a desired shape or between two transparent substrates. An important part of this formulation is using the same mole percent aminoacrylate as carboxylic acid. These two components form a salt complex. The salt complex forms ionic centers that have a weaker interaction (intramolecular association) than the carboxylic acids would have had by themselves (intermolecular association), thus the amino acrylate breaks up the hydrogen bonding allowing for easier processing of the thermoplastic.

Recording holograms in this formulation causes the aminoacrylate and the polymerizable component to copolymerize. Even though a linear polymer is formed, the linear polymer likely contains several amino acrylate groups, each of which is ionically linked to the thermoplastic, thus creating a series of ionic crosslinks, which raises the melting temperature and $T_g$ of the mixture.

Example 6

An article having reversible chemistry is formed having the following composition:

95 wt % Poly(vinyl acetate-co-alcohol) with pendant vinyl ether (attached by reaction to the alcohol)

0.5 wt % Writing monomer such as a difunctional acrylate of Bisphenol A ethoxylate 0.025 wt % Irgacure 819™ (blue light sensitive initiator)

0.225 wt % Additive (plasticizer or inert diffusing agent)

0.25 wt % 1-Cyanoacenaphthylene

This article may be formed using a process similar to that described above in Example 1 or 2. Upon exposure to blue wavelengths of 440 nm, the mixture is crosslinked. This first exposure may be used to write a hologram of the display or data type. Upon further exposure to 405 nm, a second hologram that is erasable may be formed. This hologram may be erased by irradiating the article at Deep UV wavelengths. After the erase step, the article is capable of recording a new hologram using 405 nm light.

Example 7

An article having reversible chemistry is formed having the following composition:

95 wt % Poly(vinyl acetate-co-alcohol) with pendant vinyl ether (attached by reaction to the alcohol)

4.75 wt % Additive (plasticizer or inert diffusing agent)

0.25 wt % 1-Cyanoacenaphthylene

This article may be melt processed using extrusion into a solid article of various thicknesses. The solid article is capable of rewriteable data storage.

Example 8

An article using write-once chemistry for hologram formation is formed using the following composition:

90 wt % Poly(vinyl acetate-co-alcohol) with pendant vinyl ether (attached by reaction to the alcohol)

5 wt % Additive (plasticizer or inert diffusing agent)

5 wt % Photoinitiator (ex. Darocure™ TPO from Ciba-Geigy)

This article may be melt processed using extrusion into a solid article of various thicknesses. The solid article is capable of display holography with applications as a decorative coating.

Example 9

An article using only 5 wt % thermoplastic binder is formed using the following composition:

5 wt % Poly(ethylene oxide) with 5% pendant vinyl ether (attached by reaction to the alcohol)

80 wt % Additive (nanoparticulate fumed silica with dye absorbed to the surface to impart both solubility and color)

10 wt % Plasticizer 5 wt % Photoinitiator (ex. Irgacure 784™)

This formulation may be heated and injected between two substrates. The dye color may be any color that does not absorb green light appreciably. The solid article would be capable of display holography and would represent a temporary hologram since heating of the article after recording of the hologram will result in the destruction of the hologram.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An article comprising a holographic recording medium comprising:
    a binder component comprising at least one thermoplastic;
    a polymerizable component comprising at least one photoactive monomer that is soluble in said binder component, wherein the at least one photoactive monomer is dissolved in said binder component;
    a photoinitiator component comprising at least one photoinitiator that causes said polymerizable component to form a polymer or co-polymer when a portion of said polymerizable component is exposed to a light source; and
    a photoactive component and photobinding receptors
    wherein said holographic recording medium is capable of recording spatial light distribution via a spatial refractive index change to provide recorded data pages in said holographic recording medium;
    wherein said article behaves as a thermoplastic;
    wherein said article is volatile compound free;
    wherein said article has a melting point at least 10° C. greater than room temperature; and
    wherein said article has a thickness greater than 150 µm.

2. The article of claim 1, wherein said at least one thermoplastic comprises poly(methyl vinyl ether-alt-maleic anhydride).

3. The article of claim 1, wherein said at least one thermoplastic comprises poly(vinyl acetate).

4. The article of claim 1, wherein said photoactive monomer is an acrylate.

5. The article of claim 4, wherein said photoactive monomer is tribromophenyl acrylate.

6. The article of claim 4, wherein said monomer is bisphenol A glycerolate (1 glycerol/phenol) diacrylate.

7. The article of claim 1, wherein said monomer is monofunctional.

8. The article of claim 1, wherein said monomer is difunctional.

9. The article of claim 1, wherein said monomer is multifunctional.

10. The article of claim 1, wherein when a portion of said article is exposed to radiation to which said photoinitiator component is sensitive, said monomer forms a polymer that is soluble and dissolved in said binder component.

11. The article of claim 1, wherein said polymerizable component comprises a mixture of at least two monomers.

12. The article of claim 11, wherein at least one of said at least two monomers is monofunctional.

13. The article of claim 11, wherein at least one of said at least two monomers is difunctional.

14. The article of claim 11, wherein at least one of said at least two monomers is multifunctional.

15. The article of claim 11, wherein when a portion of said article is exposed to radiation to which said photoinitiator component is sensitive, said at least two monomers form a co-polymer that is soluble and dissolved in said binder component.

16. The article of claim 1, wherein said polymerizable component comprises a mixture of at least one monomer and at least one oligomer.

17. The article of claim 16, wherein at least one member selected from the group consisting of said at least one monomer and said at least one oligomer is monofunctional.

18. The article of claim 16, wherein at least one member selected from the group consisting of said at least one monomer and said at least one oligomer is difunctional.

19. The article of claim 16, wherein at least one member selected from the group consisting of said at least one monomer and said at least one oligomer is multifunctional.

20. The article of claim 16, wherein when a portion of said article is exposed to radiation to which said photoinitiator component is sensitive, said at least one monomer and said at least one oligomer form a co-polymer that is soluble and dissolved in said binder component.

21. The article of claim 1, wherein said photoinitiator component comprises two photoinitiators.

22. The article of claim 21, wherein said photoinitiator further comprises at least one member selected from the group consisting of: thionin perchlorate with tetraphenyl borate salt (tetrabutyl amine cation) as a coinitiator, triphenylphosphine oxide, and bis($\eta$-5-2,4-cyclopentadien-1-yl) bis[2,6-difluoro-3-(1H-pyrrol-1-yl)phenyl]titanium.

23. The article of claim 1, wherein said at least one photoinitiator is activated by radiation having a wavelength between about 200 nm and about 800 nm.

24. The article of claim 1, wherein said article includes at least one plasticizer.

25. The article of claim 24, wherein said plasticizer is glycerol propoxylate.

26. The article of claim 24, wherein said plasticizer is hydroxypropyl acrylate.

27. The article of claim 1, wherein said article is substantially optically flat.

28. The article of claim 1, wherein said article comprise film on a substrate.

29. The article of claim 1, wherein said article is a free flexible film.

30. The article of claim 1, wherein said article is a stiff sheet.

31. An article comprising a holographic recording medium comprising:
a porous substrate;
a binder component comprising at least one thermoplastic;
a polymerizable component comprising at least one photoactive monomer that is soluble in said binder component, wherein the at least one photoactive monomer is dissolved in said binder component;
a photoinitiator component comprising at least one photoinitiator that causes said polymerizable component to form a polymer or co-polymer when a portion of said polymerizable component is exposed to a light source; and
a photoactive component and photobinding receptors
wherein said holographic recording medium is capable of recording spatial light distribution via a spatial refractive index change to provide recorded data pages in said holographic recording medium;
wherein said article behaves as a thermoplastic;
wherein said article is volatile compound free;
wherein said article has a melting point at least 10° C. greater than room temperature;
wherein said article has a thickness greater than 150 µm;
wherein said porous substrate is infused with said binder component, said polymerizable component and said photoinitiator.

32. The article of claim 31, wherein said porous substrate comprises glass.

33. The article of claim 31, wherein said porous substrate comprises paper.

34. The article of claim 31, wherein said porous substrate comprises plastic.

35. The article of claim 31, wherein said porous substrate comprises cloth.

36. The article of claim 1, wherein said article has a holographic grating formed therein.

37. The article of claim 1, wherein said polymerizable component comprises less than about 20 volume % of said article.

38. The article of claim 1, wherein said polymerizable component comprises less than about 10 volume % of said article.

39. The article of claim 1, wherein said polymerizable component comprises less than about 5 volume % of said article.

40. The article of claim 1, wherein part or all of said photoactive component is photoreversible.

41. The article of claim 40, wherein said photoreversible component is an anthracene derivative or an acenaphthylene derivative.

42. The article of claim 41, wherein said acenaphthylene derivative is multifunctional.

43. The article of claim 1, wherein said article includes one or more additives selected from the group consisting of the following additives: pigments, fillers, nonphotoinitiating dyes, antioxidants, inhibitors, bleaching agents, mold releasing agents, antifoaming agents, surfactants, infrared/microwave absorbers, and inert diffusing agents.

44. The article of claim 1, wherein said article comprises wrapping paper.

45. The article of claim 1, wherein said article comprises a cardboard box.

46. The article of claim 1, wherein said article comprises a label.

47. The article of claim 46, wherein said article comprises a security means for said label.

48. The article of claim 1, wherein said article comprises a billboard.

49. The article of claim 1, wherein said article comprises a piece of furniture.

50. The article of claim 1, wherein said article comprises a window.

51. The article of claim 1, wherein said article comprises a data storage device.

52. The article of claim 51, wherein said article has an antireflective coating thereon.

53. The article of claim 1, wherein said article is formed without using a solvent.

54. An article comprising a holographic recording medium comprising:
- a binder component comprising at least one thermoplastic;
- a polymerizable component comprising at least one photoactive monomer that is soluble in said binder component, wherein the at least one photoactive monomer is dissolved in said binder component; and
- a photoinitiator component comprising at least one photoinitiator that causes said polymerizable component to form a polymer or co-polymer when a portion of said polymerizable component is exposed to a light source;
- wherein said holographic recording medium is capable of recording spatial light distribution via a spatial refractive index change to provide recorded data pages in said holographic recording medium;
- wherein said article behaves as a thermoplastic;
- wherein said article is volatile compound free;
- wherein said article has a melting point at least 10° C. greater than room temperature;
- wherein said article has a thickness greater than 150 µm; and
- wherein when a portion of said polymerizable component forms a polymer or copolymer due to being exposed to said light source said binder component becomes covalently crosslinked with said polymer or copolymer.

55. An article comprising a holographic recording medium comprising:
- a binder component comprising at least one thermoplastic;
- a polymerizable component comprising at least one photoactive monomer that is soluble in said binder component, wherein the at least one photoactive monomer is dissolved in said binder component; and
- a photoinitiator component comprising at least one photoinitiator that causes said polymerizable component to form a polymer or co-polymer when a portion of said polymerizable component is exposed to a light source;
- wherein said holographic recording medium is capable of recording spatial light distribution via a spatial refractive index change to provide recorded data pages in said holographic recording medium;
- wherein said article behaves as a thermoplastic;
- wherein said article is volatile compound free;
- wherein said article has a melting point at least 10° C. greater than room temperature;
- wherein said article has a thickness greater than 150 µm; and
- wherein when a portion of said polymerizable component forms a polymer or copolymer due to being exposed to said light source said binder component becomes non-covalently crosslinked with said polymer or copolymer.

56. An article comprising a holographic recording medium comprising:
- a binder component comprising at least one thermoplastic;
- a polymerizable component comprising at least one photoactive monomer that is soluble in said binder component, wherein the at least one photoactive monomer is dissolved in said binder component; and
- a photoinitiator component comprising at least one photoinitiator that causes said polymerizable component to form a polymer or co-polymer when a portion of said polymerizable component is exposed to a light source, wherein said holographic recording medium is capable of recording spatial light distribution via a spatial refractive index change to provide recorded data pages in said holographic recording medium;
- wherein said holographic recording medium is capable of recording spatial light distribution via a spatial refractive index change to provide recorded data pages in said holographic recording medium;
- wherein said article includes a slow thermosetting agent, wherein the thermosetting agent causes one or more thermoplastics in the binder component to eventually thermoset, but does not cause any of the thermoplastics in the binder component to become thermoset in fewer than 10 minutes when the article is cooled back to room temperature after the article has been heated to be in a flowable state;
- wherein said article behaves as a thermoplastic prior to the thermosetting agent causing one or more thermoplastics in the binder component to thermoset;
- wherein said article is volatile compound free;
- wherein said article has a melting point at least 10° C. greater than room temperature; and
- wherein said article has a thickness greater than 150 µm.

57. The article of claim 56, wherein said slow thermosetting agent is a slow thermosetting agent selected from the group consisting of one or more of the following thermosetting agents: a multifunctional alcohol, a multifunctional epoxide, a multifunctional cyclic anhydride, a multifunctional secondary and/or tertiary isocyanate, and a multifunctional strained cyclic lactone.

58. The article of claim 56, wherein said article is formed without using a solvent.

59. An article comprising a holographic recording medium comprising:
- a binder component comprising at least one thermoplastic;
- a polymerizable component comprising at least one photoactive monomer that is soluble in said binder component, wherein the at least one photoactive monomer is dissolved in said binder component; and
- a photoinitiator component comprising at least one photoinitiator that causes said polymerizable component to form a polymer or co-polymer when a portion of said polymerizable component is exposed to a light source;
- wherein said holographic recording medium is capable of recording spatial light distribution via a spatial refractive index change to provide recorded data pages in said holographic recording medium;
- wherein said article behaves as a thermoplastic;
- wherein said article is volatile compound free;
- wherein said article has a melting point at least 10° C. greater than room temperature;
- wherein said article has a thickness greater than 150 µm; and
- wherein vinyl ether functionalities are attached to said at least one thermoplastic.

60. An article comprising a holographic recording medium comprising:
- a binder component comprising at least one thermoplastic;
- a polymerizable component comprising at least one photoactive monomer that is soluble in said binder component, wherein the at least one photoactive monomer is dissolved in said binder component; and
- a photoinitiator component comprising at least one photoinitiator that causes said polymerizable component to form a polymer or co-polymer when a portion of said polymerizable component is exposed to a light source;

wherein said holographic recording medium is capable of recording spatial light distribution via a spatial refractive index change to provide recorded data pages in said holographic recording medium;
wherein said article behaves as a thermoplastic;
wherein said article is volatile compound free;
wherein said article has a melting point at least 10° C. greater than room temperature;
wherein said article has a thickness greater than 150 µm; and
wherein said binder component comprises a plurality of thermoplastics and wherein vinyl ether functionalities are attached to at least one of said thermoplastics.

61. A solid article comprising a holographic recording medium comprising:
    a binder component comprising at least one thermoplastic; and
    a photoactive component comprising at least one photoactive molecule that is soluble and dissolved in said binder component, wherein said article has a melting point at least 10° C. greater than room temperature and wherein said holographic recording medium is capable of recording spatial light distribution via a spatial refractive index change to provide recorded data pages in said holographic recording medium;
    wherein part or all of said photoactive component is photoreversible and wherein said binder component contains photobinding receptor
    wherein said article behaves as a thermoplastic, and
    wherein said article is volatile compound free; and
    wherein said article has a thickness greater than 150 µm.

62. The article of claim 61, wherein said spatial refractive index change is caused primarily by mass diffusion.

63. The article of claim 61, wherein said article is formed without using a solvent.

64. An article comprising:
    a binder component comprising at least one thermoplastic;
    a polymerizable component comprising at least one photoactive monomer that is soluble in said binder component, wherein the at least one photoactive monomer is dissolved in said binder component; and
    a photoinitiator component comprising at least one photoinitiator that causes said polymerizable component to form a polymer or co-polymer when a portion of said polymerizable component is exposed to a light source,
    wherein said article is capable of recording spatial light distribution via a spatial refractive index change;
    wherein said article has a 90° light scattering Rayleigh ratio of less than $7 \times 10^{-3}$ cm$^{-1}$;
    wherein said article behaves as a thermoplastic;
    wherein said article is volatile compound free;
    wherein said article has a melting point at least 10° C. greater than room temperature; and
    wherein said article has a thickness greater than 150 µm.

65. The article of claim 64, wherein said article is formed without using a solvent.

* * * * *